United States Patent
Son

(10) Patent No.: US 9,570,209 B2
(45) Date of Patent: Feb. 14, 2017

(54) CONDUCTIVE LAYER AND PREPARATION METHOD FOR CONDUCTIVE LAYER

(71) Applicant: LG CHEM, LTD., Seoul (KR)

(72) Inventor: Phil Kook Son, Busan (KR)

(73) Assignee: LG CHEM, LTD., Seoul (KR)

( * ) Notice: Subject to any disclaimer, the term of this patent is extended or adjusted under 35 U.S.C. 154(b) by 74 days.

(21) Appl. No.: 13/765,470

(22) Filed: Feb. 12, 2013

(65) Prior Publication Data

US 2014/0227560 A1 Aug. 14, 2014

(51) Int. Cl.
*H01B 1/08* (2006.01)
*G06F 3/041* (2006.01)
*H01L 31/0224* (2006.01)
*H01L 31/18* (2006.01)

(52) U.S. Cl.
CPC ............... *H01B 1/08* (2013.01); *G06F 3/041* (2013.01); *H01L 31/022466* (2013.01); *H01L 31/1884* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 5,099,294 A * | 3/1992 | Hunt | H01L 39/223 257/32 |
| 6,383,345 B1 * | 5/2002 | Kim et al. | 204/192.11 |
| 6,852,406 B2 * | 2/2005 | Marechal et al. | 428/336 |
| 2011/0037087 A1 * | 2/2011 | Watanabe | H01L 33/0079 257/94 |

FOREIGN PATENT DOCUMENTS

KR 101161301 B1 5/2012

OTHER PUBLICATIONS

Sung-Hwan Paeng: Surface & Coating Technology 205 (2010), "Transparent conductive characteristics of Ti:ITO films deposited by RF magnetron sputtering at low substrate temperature" (S210-S215).

* cited by examiner

*Primary Examiner* — Adam Krupicka
(74) *Attorney, Agent, or Firm* — Dentons US LLP

(57) ABSTRACT

Provided are a conductive layer and a method of manufacturing the same. The conductive layer is formed without, so called, a high temperature process but has suitable crystallinity, excellent transparency and excellent resistance characteristic, and the method of manufacturing the same is also provided.

17 Claims, 15 Drawing Sheets

(a)          (b)

(a)                  (b)

CONDUCTIVE LAYER AND PREPARATION METHOD FOR CONDUCTIVE LAYER

BACKGROUND

1. Field of the Invention

The present application relates to a conductive layer and a method of manufacturing the same.

2. Discussion of Related Art

Various apparatuses such as a liquid crystal display (LCD), a light emitting diode, and a solar cell need a conductive layer having high transparency to visible light and low resistance.

Recently, according to propagation of mobile devices and demands for smaller and lighter devices, it is required that the conductive layer be formed on a lighter substrate.

While the most frequently used transparent conductive layer is a transparent conducive layer (so called, an indium tin oxide (ITO) layer) having indium-tin-oxygen (In—Sn—O) formed on a glass substrate as a main component, due to the recent demands for the smaller and lighter devices, it is also considered that a conductive layer be formed on a plastic base layer, which is lighter than the glass substrate.

A conductive layer is usually formed by DC magnetron sputtering, RF magnetron sputtering, vacuum deposition, or ion plating. However, the conductive layer formed on a plastic base layer by the above-described method, for example, an ITO layer, generally has a lower resistance characteristic than an ITO layer formed on a glass substrate.

There are many reasons for the lower resistance, but a representative one may be that the plastic base layer has a lower thermal resistance than the glass substrate. That is, because of deterioration of the thermal resistance, the ITO layer should be formed at a lower temperature than that of the glass substrate, and thus crystals of the ITO layer cannot be sufficiently grown.

Crystallinity of the ITO layer may be determined by X-ray diffraction (XRD). For example, according to the XRD analysis, in a polycrystalline ITO layer, three reflections are observed. An index of the reflections is determined by a mirror index, and these reflections are derived from (222), (400) and (440) planes from a lower angle side. When Cu-kα is used as an X-ray source, it is known that reflection from the (222) plane is shown at approximately 30.5 (2θ) degrees, reflection from the (400) plane is shown at approximately 35 (2θ) degrees, and reflection from the (440) plane is shown at approximately 50.5 (2θ) degrees. For example, in FIG. 4 of Non-patent reference 1 [「Transparent conductive film」 (「HYOUMEN」 vol. 18, No. 8 (1980) 440-449)], an XRD pattern of a thermally treated crystalline ITO layer deposited a polyester film is disclosed. In addition, in Non-patent reference 2 [「SHINKU」 vol. 30, No. 6, 546-554], an XRD pattern of the crystalline ITO layer formed on a glass substrate by sputtering is disclosed. On an XRD intensity curve, peaks derived from the reflection from the (222), (400) and (440) planes were shown.

It is known that conventional structure and characteristics of the ITO layer are highly dependent on a temperature of forming the ITO layer. The ITO layer formed at low temperature such as room temperature is usually amorphous.

For example, a method of controlling crystal alignment for the (400) plane to be parallel to a glass substrate to reduce a resistance of the ITO layer formed on the substrate is suggested in Japanese Patent Application Laid-Open No. 1995-090550. In Japanese Patent Application Laid-Open No. 1995-090550, the ITO layer formed in a direction 100, for example, formed such that the (400) plane is parallel to the substrate, decreases in resistivity. To realize the crystal alignment, it is important to form the ITO layer at a high temperature of 200° C. or more.

There are several researches to control crystal alignment in a high temperature process for forming a layer at high temperature.

It is known that a structure of the ITO layer formed on the glass structure varies depending on a forming atmosphere. For example, in Japanese Patent Application Laid-Open No. 1997-050712, the diameter and number of a crystal may be controlled in an atmosphere in which vapor, which is an impurity gas, is present, and in Japanese Patent Application Laid-Open No. 1996-092740, a method of controlling a structure of a layer by actively removing an impurity gas and building a vacuum system is disclosed.

However, since the plastic base layer may not be usually heated at high temperature, crystals may not be sufficiently grown during the formation of the conductive layer, and it is difficult to realize physical properties such as a low resistance like a glass substrate.

SUMMARY OF THE INVENTION

The present application is directed to providing a conductive layer and a method of manufacturing the same.

One aspect of the present application provides a conductive layer having crystallinity. The term "crystallinity" used herein refers to, so called, crystallinity or semi-crystallinity in the related art. For example, the term "crystallinity" used herein may refer that peak(s) is(are) observed from at least (222) plane and/or (400) plane in XRD analysis. The peak may be observed from one or both of the (222) and (440) planes. In addition, the sentence "peak is observed" may refer that an intensity of the peak is at least 100 arbitrary unit (AU) or more. The intensity of the peak of the (222) plane may be, for example, 150, 200, 250, 300, 350, 400, 450 or 500 AU or more. The upper limit of the intensity of the peak of the (222) plane is not particularly limited, and for example, the intensity of the peak may be approximately 7,000 or 6,500, or approximately 6,000 AU or less. In addition, in the case of the (400) plane, the "crystallinity" may refer that the intensity of the peak is 100 AU or more. The intensity of the peak of the (400) plane may be, for example, 150, 200, 250, 300, 350, 400, 450, 500, 1,000, 2,000, 3,000, 4,000, 5,000, 6,000, 6,500, 7,000, 7,500, 8,000 or 8,500 AU or more. The upper limit of the intensity of the peak of the (400) plane is not particularly limited, and the intensity of the peak may be, for example, 20,000 or 18,000, or approximately 15,000 AU or less. The intensity of the peak is a value represented as AU, which is measured by a conventional known method, and the unit "AU" is a unit converted with respect to a spectrum of an amorphous layer, which has no crystallinity.

The conductive layer is formed on a surface having a contact angle of 75 degrees of more. On the surface having a contact angle of 75 degrees or more, a conductive layer having desired crystallinity or semi-crystallinity may be formed without high-temperature treatment, for example, annealing treatment, which is necessary to grow crystals. The "contact angle" used herein is a contact angle measured at room temperature using distilled water, particularly, by a method described in the following Example. In addition, the "contact angle" used herein refers to a contact angel before a conductive layer is formed on a surface. The term "room temperature" used herein may refer to a temperature as it is, which is not increased or decreased, for example, approximately 10 to 30, 15 to 30, 20 to 30, or or 23° C. In another example, the contact angle on the surface may be approximately 75 to 120, 80 to 120, 80 to 110, 80 to 100 or 80 to 95 degrees.

The conductive layer may be formed to have a suitable level of crystallinity without a high temperature process and may exhibit excellent transparency and resistance characteristics. For example, the conductive layer may have an optical transmittance with respect to at least one wavelength in a visible region or an entire region of visible light of 80, 85, or 90% or more. In addition, the conductive layer may have resistivity measured by a four-point probe method of $2 \times 10^{-3}$, $1.5 \times 10^{-3}$, or $1 \times 10^{-3}$ cm or less. The conductive layer may be decreased in resistivity, but the lower limit of the resistivity is not particularly limited.

The conductive layer may be formed of various materials. For example, the conductive layer may include a metal such as gold, silver, platinum, palladium, copper, aluminum, nickel, chromium, titanium, iron, cobalt or tin or an alloy of at least two thereof; a metal oxide such as indium oxide, tin oxide, titanium oxide cadmium oxide or a mixture of at least two thereof; or a metal compound such as a copper iodide.

In one example, the conductive layer may include, for example, indium oxide. In one example, the conductive layer may include indium oxide as a main component, and may be a layer of composite oxide further including at least one selected from the compounds having a large band gap such as tin oxide, zinc oxide, antimony oxide, aluminum oxide, potassium oxide, cesium oxide, magnesium oxide, cadmium oxide, copper oxide, tungsten oxide, and rhenium oxide. Conventionally, the conductive layer may include indium oxide and tin oxide, and the tin oxide may be included at approximately 2.5 to 25 or 7.5 to 17.5 wt % based on the indium oxide. For example, a conductive layer including 85 to 95 parts by weight of indium oxide and 5 to 15 parts by weight of tin oxide may be used. The unit "parts by weight" used herein refers to, unless specifically defined otherwise, a weight ratio between components.

A thickness of the conductive layer is selected in consideration of optical transmittance or resistance characteristics, but the present application is not particularly limited thereto. Conventionally, the thickness of the conductive layer may be approximately 10 to 300 or 20 to 200 nm.

Another aspect of the present application provides a conductive film. The conductive film may include a base layer and a conductive layer formed on one surface of the base layer, for example, the above-described conductive layer. For example, the surface of the base layer is a surface having a contact angle, as described above, and the conductive layer may be formed on the surface. In this case, the conductive layer may be formed in contact with the surface, and a different kind of layer may be further included between the base layer and the conductive layer.

A kind of the base layer included in the conductive film is not particularly limited. For example, when lightness is required, a plastic base layer may be used as the base layer. As described above, when the plastic base layer is used, since it is difficult to perform a high temperature process during the formation of the conductive layer, it is difficult to form the conductive layer having sufficient crystallinity. However, when a contact angle on the surface of the base layer is controlled within the above-described range and the conductive layer is formed on the surface, the conductive layer having desired crystallinity may be formed without the high temperature process. The contact angle on the surface of the base layer may be controlled by oxygen plasma treatment, ion beam treatment and/or thermal treatment to be disclosed in the following manufacturing method.

As the plastic base layer, any kind of layer having optical transparency may be used. As the plastic base layer, for example, a polycarbonate base layer, a polyester base layer such as poly(ethylene terephthalate) (PET), a polyimide base layer, a poly(vinyl chloride) base layer, a polystyrene base layer, or a polyolefin base layer such as a polyethylene or polypropylene base layer may be used.

The plastic base layer may be a non-stretched, or uniaxially or biaxially-stretched base layer. The plastic base layer may conventionally have a thickness of, but not particularly limited to, approximately 3 to 300, 5 to 250, or 10 to 200 μm.

In the conductive film, various necessary components may be further included, other than the base layer and the conductive layer. For example, the conductive film may further include an intermediate layer between the base layer and the conductive layer.

The intermediate layer may be formed in consideration of, for example, a cohesive property between the conductive layer and the base layer, scratch resistance, flexible resistance, and spot characteristics.

The intermediate layer may include an inorganic material, an organic material, or an organic and inorganic composite material. As the inorganic material, for example, $SiO_2$, $MgF_2$ or $Al_2O_3$ may be used, as an organic material, acryl polymer, urethane polymer, melamine polymer, alkyd polymer or siloxane polymer may be used, and as an organic and inorganic composite material, a composite of at least one inorganic material and at least one organic material may be used. In one example, the intermediate layer may be formed using a sol-gel reaction product of a mixture including organic silane or a heat-curing resin including a mixture of a melamine resin, an alkyd polymer, and an organic silane condensed product as an organic material.

The intermediate layer may be formed by, for example, vacuum deposition, sputtering, ion plating, or wet or dry coating. A thickness of the intermediate layer may be conventionally controlled within a range of 100 nm or less, particularly, 15 to 100 or 20 to 60 nm.

In the conductive film, an adhesive layer or pressure-sensitive adhesive layer may be present. Such an adhesive layer or pressure-sensitive adhesive layer may be formed on the base layer on which the conductive layer is not formed, or on the conductive layer when necessary.

The conductive film may further include a pressure-sensitive adhesive layer or adhesive layer formed on a surface of the base layer on which the conductive layer is not formed, and a transparent sheet layer or releasing sheet layer attached to the base layer by the pressure-sensitive adhesive layer, when necessary.

As the transparent sheet layer, for example, a suitable kind may be selected from the transparent plastic base layer or glass substrate, which may be used as the base layer. When the transparent sheet layer is included, a thickness of the transparent sheet layer may be controlled to be higher than the base layer. In one example, the thickness of the transparent sheet layer may be controlled within a range of 50 to 300 or 75 to 200 μm, and a thickness of the base layer may be controlled within a range of 3 to 100 or 10 to 50 μm, such that the transparent sheet layer may have a higher thickness than the base layer. As the releasing film layer, for example, a releasing film conventionally used in the field of a pressure-sensitive adhesive sheet may be used.

The conductive film may further include a hard coating layer formed on an opposite surface to the surface facing the base layer of the transparent sheet layer. The hard coating layer may be formed by, for example, a hard coating method including coating and curing a hard resin such as an acrylurethane-based resin or a siloxane-based resin. In the hard coating method, a surface may be roughened by blending a silicon resin to the hard resin such as an acrylurethane-based resin or a siloxane-based resin, and a non-glare surface capable of preventing reflection by a mirror effect when applied to a touch panel may be simultaneously formed. Such a hard coating layer may be formed to have a thickness of approximately 0.1 to 30 μm in consideration of hardness, crack resistance and an anti-curling property.

Still another aspect of the present application provides a method of forming a conductive layer, for example, the conductive layer described above. The method may include forming a conductive layer on a surface having a contact angle of, for example, approximately 75 degrees or more, or approximately 75 to 120, 80 to 120, 80 to 110, 80 to 100 or 80 to 95 degrees.

The method of manufacturing a conductive layer may employ a known suitable method according to a material to be used. The conductive layer may be formed by, for example, vacuum deposition, sputtering, ion plating, spray pyrolysis, chemical plating or electroplating.

The conductive layer is formed on a surface having the above-described contact angle. When the conductive layer is formed on the surface having the contact angle, the crystalline conductive layer having desired crystallinity may be formed without using, so called, a high temperature process.

In one example, the surface having the contact angle may be a surface of the base layer treated by oxygen plasma treatment or ion beam treatment. The base layer may be, for example, a plastic base layer.

For example, the surface may be a surface of the base layer treated by oxygen plasma treatment, which may be performed with a power of approximately 20 to 50 Watt (W). According to the oxygen plasma treatment, the contact angel of the surface of the base layer may be controlled within the above range. That is, as shown in FIG. 1, the method of manufacturing the conductive layer may sequentially include oxygen plasma treatment with respect to a base layer 101 and formation of a conductive layer 102.

During the treatment of the base layer, the oxygen plasma treatment may be performed with a power of approximately 20 to 50, 25 to 50 or 30 to 50 W. When the power of the plasma treatment is included in the above range, surface characteristics of the base layer may be suitably controlled, and thus a conductive layer having desired characteristics may be formed. The plasma treatment may be performed, for example, at room temperature.

Other conditions for the plasma treatment are not particularly limited. For example, the plasma treatment may be performed by controlling flow of oxygen of approximately 10 to 20 sccm under a working pressure of approximately $10^{-5}$ torr to $2 \times 10^{-4}$ torr, using a conventional apparatus such as a low-pressure radio-frequency plasma chamber (R.F. plasma chamber). During the plasma treatment, an exposure time may be controlled to approximately 1 to 60, 1 to 50, 1 to 40, 1 to 30, 1 to 20 or 1 to 10 seconds, and an incident angle may be controlled to approximately 50 to 90 or 60 to 80 degrees, but the present application is not limited thereto.

In another example, the surface may be a surface of the base layer to which the ion beam treatment is performed. The ion beam treatment may be performed with an ion beam energy of approximately 40 to 80 eV. According to such treatment, the contact angle of the surface of the base layer may be controlled within the above range. That is, the method of manufacturing the conductive layer may sequentially include ion beam treatment with respect to a base layer and formation of a conductive layer. Such a process may be performed, for example, at room temperature.

The ion beam treatment to the base layer may be performed with an ion beam energy of approximately 40 to 80, 45 to 75, 50 to 75 or 50 to 70 eV. When the ion beam energy is included in the range, surface characteristics of the base layer may be suitably controlled, and thus the conductive layer having desired characteristics may be formed. The ion beam treatment may be performed, for example, at room temperature, or under a suitable increased temperature condition, which will be described later.

Other conditions for the ion beam treatment are not particularly limited. For example, the ion beam treatment may be performed using a cold hollow cathode-based ion source. During the ion beam treatment, an incident angle may be controlled to, for example, approximately 60 to 100 or 70 to 90 degrees, an exposure time may be controlled to approximately 1 to 60, 1 to 50, 1 to 40, 1 to 30, 1 to 20 or 1 to 10 seconds, and a flux density may be controlled to approximately $10^{12}$ to $10^{14}$ or $10^{13}$ to $5 \times 10^{13}$ ions/scm$^2$, but the present application is not limited thereto.

In one example, the method of manufacturing the conductive layer may further include forming a conductive layer on the base layer to which the ion beam treatment is performed and performing the ion beam treatment to the conductive layer. For example, in the manufacturing method, the formation of a conductive layer and the ion beam treatment to the conductive layer may be repeatedly performed. For example, after the formation of the conductive layer and the ion beam treatment to the conductive layer, another conductive layer may be formed on the conductive layer, and the ion beam treatment may be performed again to the conductive layer further formed. For example, the formation of the conductive layer, as shown in FIG. 2, may sequentially include ion beam treatment to a base layer 101, formation of a conductive layer 102, ion beam treatment to the conductive layer 102, formation of the conductive layer 102 and ion beam treatment to the conductive layer 102, and during the process, the formation of a conductive layer and the ion beam treatment to the conductive layer may be repeatedly performed.

In the repeated performance, conditions for the ion beam treatment may be the same as described above. In addition, the number of repeating the performance is not particularly limited, and thus the formation of a conductive layer and the ion beam treatment to the conductive layer may be repeated 10 to 40, to 40, 17 to 40, 17 to 30, 17 to 25 or 17 to 23 times. During the repeated process, when necessary, the ion beam treatment may be suitably omitted.

During the repeated process, a thickness of the conductive layer formed in each operation may be selected in a range of, for example, approximately 1 to 10 nm in consideration of the repeated number and the desired thickness without particular limitation.

As described above, the ion beam treatment may be performed at room temperature, and when necessary, under a suitable increased temperature condition. For example, the ion beam treatment may be performed at an increased temperature of approximately 70 to 200, 80 to 200, 80 to 190, 80 to 180, 80 to 170, 80 to 160, 80 to 150, 80 to 140, 85 to 140 or 90 to 140° C. According to the ion beam treatment under the suitable increased temperature condition, surface characteristics of the base layer may be more suitably controlled.

When the ion beam treatment is performed under the increased temperature condition, the conductive layer may also be formed under the increased temperature condition.

For example, after the ion beam treatment under the increased temperature condition, the conductive layer may be formed under the same condition as that for the ion beam treatment. For example, a base layer treated by ion beam treatment at the above temperature is left under the same increased temperature condition of approximately 70 to 200, 80 to 200, 80 to 190, 80 to 180, 80 to 170, 80 to 160, 80 to 150, 80 to 140, 85 to 140 or 90 to 140° C., thereby forming the conductive layer. According to the method as described above, the conductive layer having suitable crystallinity and excellent other physical properties may be formed.

The conductive layer, the conductive film or the method of forming the conductive layer may be effectively used for various applications required for, for example, a display device such as an LCD, a light emitting diode, a solar cell, or a transparent conductive layer.

BRIEF DESCRIPTION OF THE DRAWINGS

The above and other objects, features and advantages of the present application will become more apparent to those of ordinary skill in the art by describing in detail exemplary embodiments thereof with reference to the adhered drawings, in which.

DETAILED DESCRIPTION OF EXEMPLARY EMBODIMENTS

Figure 1:
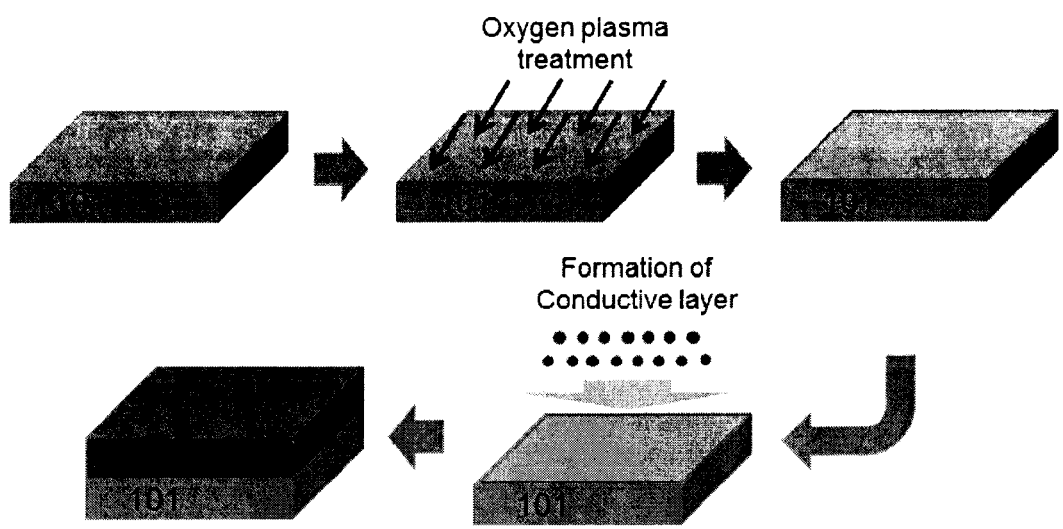
FIGS. 1 and 2 are schematic diagrams showing a method of forming a conductive layer.

Hereinafter, exemplary embodiments of the present application will be described in detail. However, the present application is not limited to the embodiments disclosed below but can be implemented in various forms. The following embodiments are described in order to enable those of ordinary skill in the related art to embody and practice the present application.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of exemplary embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

With reference to the appended drawings, exemplary embodiments of the present application will be described in detail below. To aid in understanding the present application, like numbers refer to like elements throughout the description of the figures, and the description of the same elements will be not reiterated.

Hereinafter, a conductive layer will be described in further detail with reference to Examples and Comparative Examples, but the scope of the conductive layer is not limited to the following Examples.

1. XRD Analysis

XRD analysis for a conductive layer (ITO layer) was performed at room temperature using an X-ray diffractometer (X'Pert Pro, Philips, PANalytical B.V., Almelo, The Netherlands) equipped with monochromic CuKα radiation (wavelength($\lambda$)=1.054056 Å) operated at 40 kV and 30 mA. A diffraction pattern was measured at room temperature in a normal θ-2θ scanning mode over angles ranging form 10 to 90 degrees with a step of 0.05 degrees, and measurement was performed at a rate of 0.2 sec/step.

2. Surface Morphology

Surface morphology of the conductive layer (ITO layer) was analyzed using atomic force microscopy (AFM) in the tapping mode (Multimode AFM Nanoscope IIIa, Digital Instruments, Inc., Tonowanda, N.Y., USA). An ultra-level cantilever with a spring constant of 26 N/m and a resonance frequency of 268 kHz was used for scanning.

3. Optical Transmittance

Optical transmittance was measured using an UV-Vis NIR spectrometer.

4. Contact Angle

A wetting property was evaluated by a static contact angle method. The contact angle was measured by increasing and then decreasing the volume of liquid (distilled water) deposited on a sample surface (PET film) at room temperature. Recorded images were digitized and analyzed with a software generally evaluating the tangent at the point of contact between a drop of the liquid and the surface.

5. Resistivity

Resistivity of the conductive layer (ITO layer) was evaluated by a four-point probe test. A sample was prepared by cutting the conductive layer to have a width of 3 cm and a length of 1 cm. A surface of the sample was washed before the resistivity was measured. Four-point probes were placed in contact with the sample, and a current of 10 mA was applied. Voltage drop was examined to measure the resistivity.

Example 1

Oxygen Plasma

A PET film (thickness: 150 μm, produced by DuPont Teijin Films, Trade Name: Q65) was treated with oxygen plasma. Specifically, the PET film was put in a low-pressure radio-frequency (R.F.) plasma chamber and treated with plasma. The plasma treatment was performed with a working pressure of approximately $10^{-4}$ torr and oxygen flow of approximately 10 sccm at room temperature. During the oxygen plasma treatment, the power, exposure time and incident angle were approximately 40 W, 5 seconds and 70 degrees, respectively.

Formation of Conductive Layer

An ITO layer was formed on an oxygen plasma-treated surface of the PET film as a conductive layer. The ITO layer was formed by RF magnetron sputtering. The formation of the ITO layer was performed using In—Sn—O as a sintering target. Argon (49.7 sccm) as an inert gas and oxygen (0.3 sccm) were injected into a chamber to perform sputtering. In the deposition chamber, a base pressure and a working process pressure were controlled to approximately $10^{-6}$ torr and $10^{-2}$ torr, respectively, thereby forming the ITO layer having a thickness of approximately 50 nm. After the formation of the ITO layer, physical properties of the ITO layer were evaluated without a separate annealing process.

Example 2

Ion Beam Treatment

Ion beam treatment, instead of plasma treatment, was performed on the PET film used in Example 1. The ion beam treatment was performed using a cold hollow cathode-based ion source. During the ion beam treatment, ion beam energy, incident angle, exposure time and flux density were controlled to approximately 50 eV, 80 degrees, 5 seconds and $3 \times 10^{13}$ ions/scm², respectively.

Formation of Conductive Layer

An ITO layer was formed on an ion beam-treated surface of the PET film as a conductive layer. The ITO layer was formed by RF magnetron sputtering. The formation of the ITO layer was performed using In—Sn—O as a sintering target. Argon (49.7 sccm) as an inert gas and oxygen (0.3 sccm) were injected into a chamber to perform sputtering. In the deposition chamber, a base pressure and a working process pressure were controlled to approximately $10^{-6}$ torr and $10^{-2}$ torr, respectively, thereby forming the ITO layer having a thickness of approximately 50 nm. After the formation of the ITO layer, physical properties of the ITO layer were evaluated without a separate annealing process.

Example 3

A conductive layer was formed by repeating the ion beam treatment and the formation of an ITO layer described in Example 2. Specifically, ion beam treatment was performed on a PET film under the same conditions as described in Example 2, an ITO layer was formed to a thickness of approximately 2 nm under the same conditions as described in Example 2, and then ion beam treatment was performed on the ITO layer under the same conditions as described in Example 2. Subsequently, the formation of an ITO layer having a thickness of 2 nm on the ion beam treated ITO layer and ion beam treatment performed on the ITO layer were repeated under the same conditions until a total thickness of the ITO layer became approximately 50 nm (total repetition number: 25 times).

Example 4

Ion Beam Treatment

Ion beam treatment, instead of plasma treatment, was performed on the PET film used in Example 1. The ion beam treatment was performed using a cold hollow cathode-based ion source. The ion beam treatment was performed on the PET film at approximately 120° C. During the ion beam treatment, ion beam energy, incident angle, exposure time and flux density were controlled to approximately 60 eV, 85 degrees, 5 seconds and $3 \times 10^{13}$ ions/scm², respectively.

Formation of Conductive Layer

An ITO layer was formed on an ion beam-treated surface of a PET film as a conductive layer. The ITO layer was formed by RF magnetron sputtering the ion beam-treated PET film at approximately 120° C. The formation of the ITO layer was performed using In—Sn—O as a sintering target. Argon (49.7 sccm) as an inert gas and oxygen (0.3 sccm) were injected into a chamber to perform sputtering. In the deposition chamber, a base pressure and a working process pressure were controlled to approximately $10^{-6}$ torr and $10^{-2}$ torr, respectively, thereby forming the ITO layer having a thickness of approximately 50 nm. After the formation of the conductive layer, physical properties were evaluated without a separate annealing process.

Comparative Example 1

An ITO layer was formed as a conductive layer by the same method as described in Example 1, except that oxygen plasma treatment was not performed on a PET film. After the formation of the conductive layer, physical properties were evaluated without a separate annealing process.

Comparative Example 2

An ITO layer was formed as a conductive layer by the same method as described in Example 1, except that power was controlled to 80 Watt during oxygen plasma treatment. After the formation of the conductive layer, physical properties were evaluated without a separate annealing process.

Comparative Example 3

An ITO layer was formed by RF magnetron sputtering the PET film used in Example 1 at approximately 120° C. The formation of the ITO layer was performed using In—Sn—O as a sintering target. Argon (49.7 sccm) as an inert gas and oxygen (0.3 sccm) were injected into a chamber to perform sputtering. In the deposition chamber, a base pressure and a working process pressure were controlled to approximately $10^{-6}$ torr and $10^{-2}$ torr, respectively, thereby forming the ITO layer having a thickness of approximately 50 nm. After the formation of the conductive layer, physical properties of the conductive layer were evaluated without a separate annealing process.

Experimental Example 1

XRD

Figure 2:
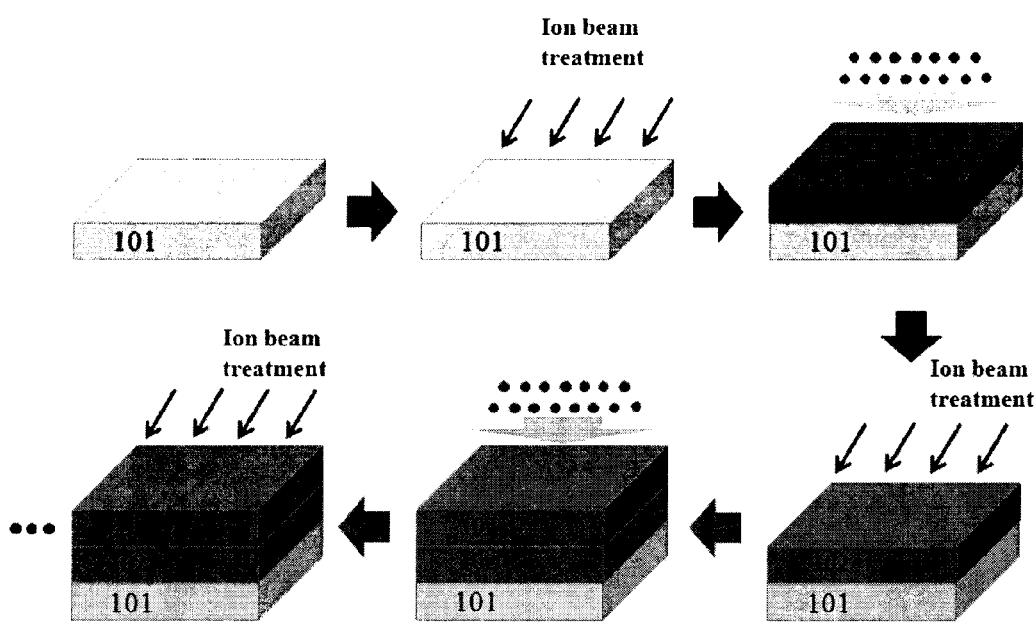
Figure 3:
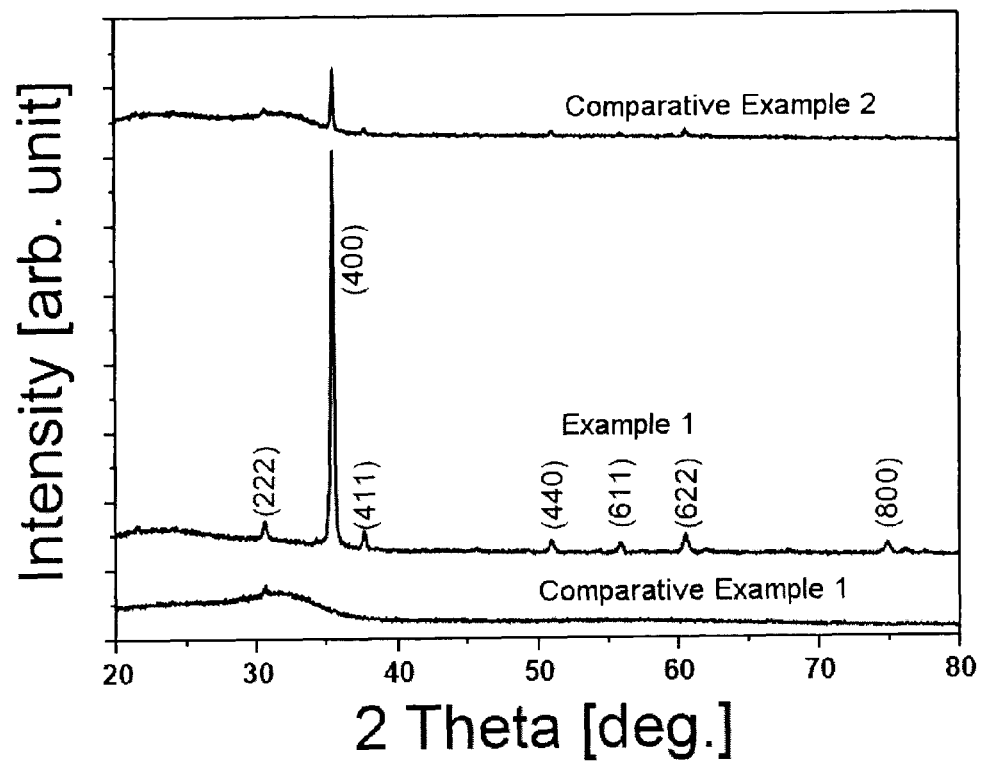
FIGS. 3 to 5 are diagrams showing results of XRD analysis for conductive layers manufactured in Examples and Comparative Examples.
Figure 4:
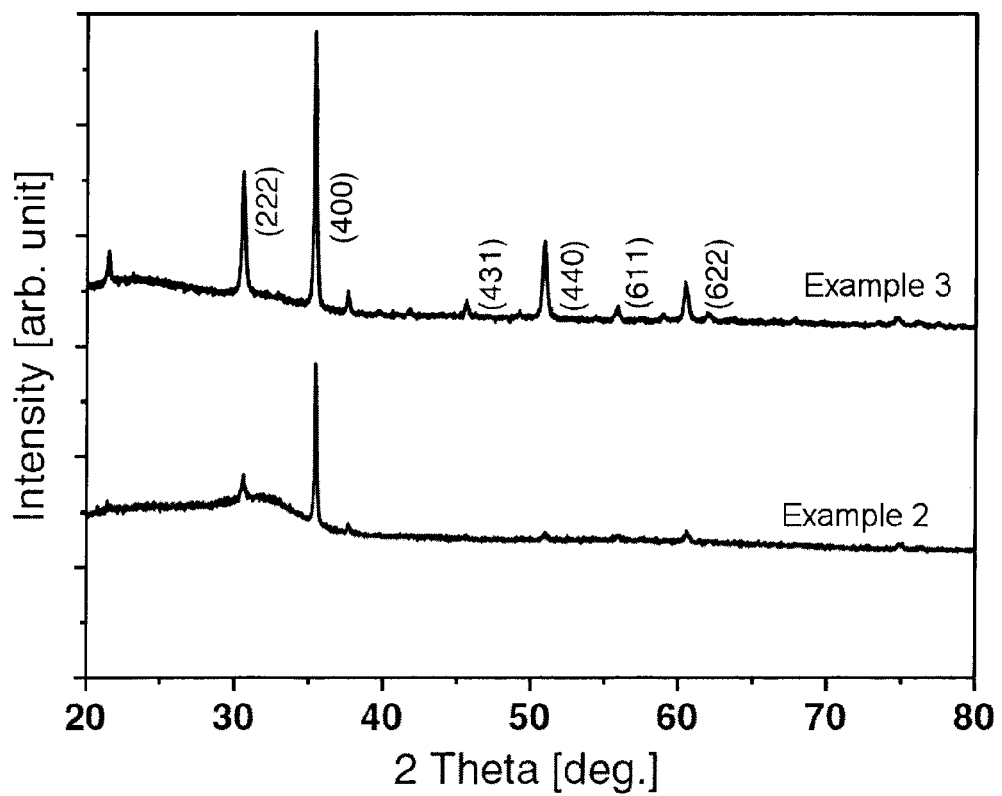
Figure 5:
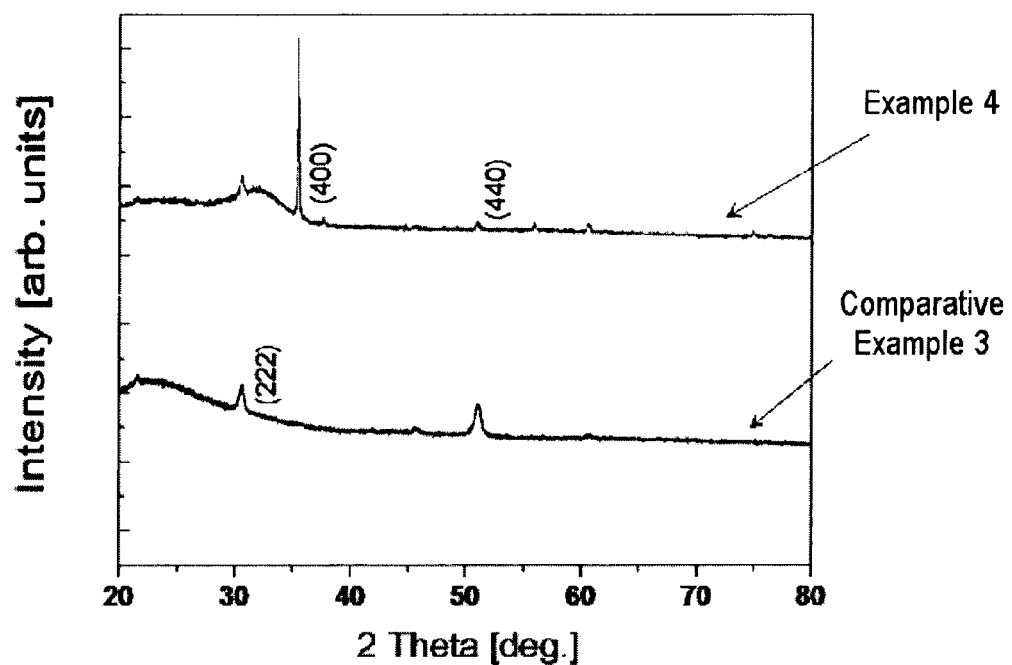

FIG. 2 shows XRD results for the conductive layers of Example 1 and Comparative Examples 1 and 2. It was confirmed from FIG. 3 that the conductive layer of Comparative Example 1 was amorphous. Compared with this, it was confirmed that the ITO layer formed on the oxygen plasma-treated PET film with a power of 40 Watt in Example 1 was poly-crystalline. In Example 1, an intensity of the (400) line was approximately 12,000 AU, and an intensity of the (222) line was approximately 600 AU. In Comparative Example 2, it was confirmed that the (400) line was observed, but the intensity of the (400) line was insignificant, and crystallinity was not suitably controlled. FIG. 4 is a diagram showing results of XRD analysis performed to Examples 2 and 3, and it was confirmed from FIG. 4 that all of the cases had the (400) and (222) lines. In FIG. 2, the intensity of the (400) line was approximately 8,700 AU, and the intensity of the (222) line was approximately 11,500 AU, and in FIG. 3, the intensity of the (400) line was approximately 11,500 AU, and the intensity of the (222) line was approximately 5,600 AU. FIG. 5 is a diagram showing results of XRD analysis performed to Example 4 and Comparative Example 3. From FIG. 5, it was confirmed that the film of Example 4 had the (400) and (222) lines. In the case of Example 4, the intensity of the (400) line was approximately 11,000 AU, and the intensity of the (222) line was approximately 670 AU.

Experimental Example 2

Surface Morphology

Figure 6:
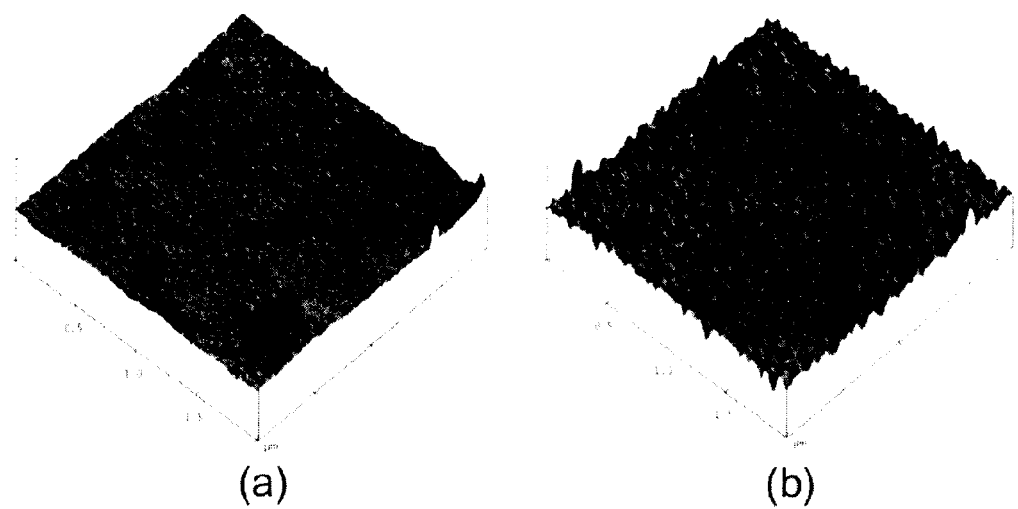
FIGS. 6 and 7 are diagrams showing results of surface morphology analysis for the conductive layers manufactured in Examples and Comparative Examples.
Figure 7:
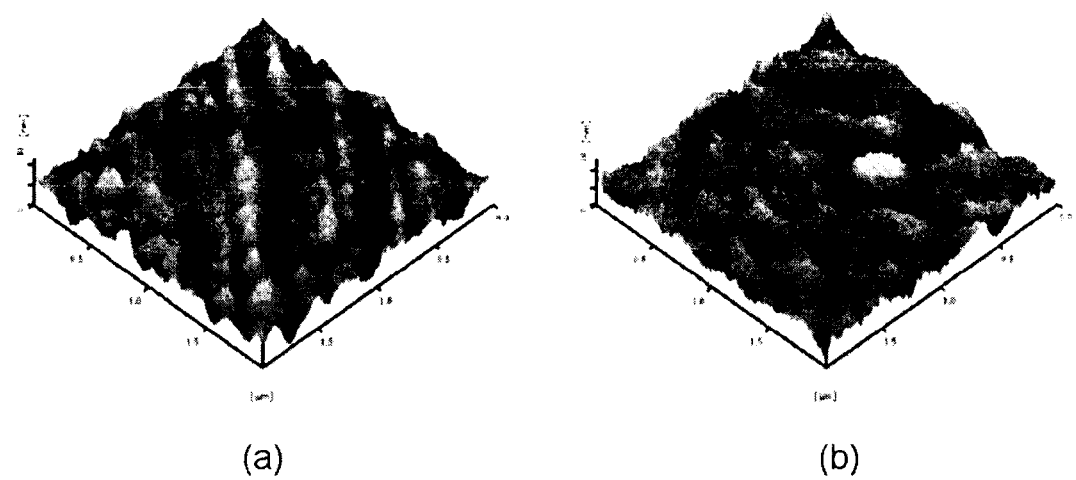

FIG. 6 shows surface morphology results measured by AFM with respect to the FET films used in Example 1 ((b) of FIG. 6) and Comparative Example 1 ((a) of FIG. 6). According to the measurement, it was confirmed that surface roughness was increased by oxygen plasma treatment. The oxygen plasma treatment was performed by changing plasma power from 30 W to 100 W, and then the surface morphology for the PET films was measured. According to the result of measurement, the surface roughness was all approximately 2.85±0.6 nm. FIG. 7 is a diagram showing the results of surface morphology for the PET films of Examples 2 ((a) of FIG. 7) and 3 ((b) of FIG. 7). According to the result of measurement, it was confirmed that the surface roughness was increased compared to when ion beam treatment was not performed. Particularly, in Comparative Example 1, the surface roughness was shown to be approximately 1.125 nm, and in Example 3, the surface roughness was shown to be approximately 2.291 nm.

Experimental Example 3

Optical Transmittance

Figure 8:
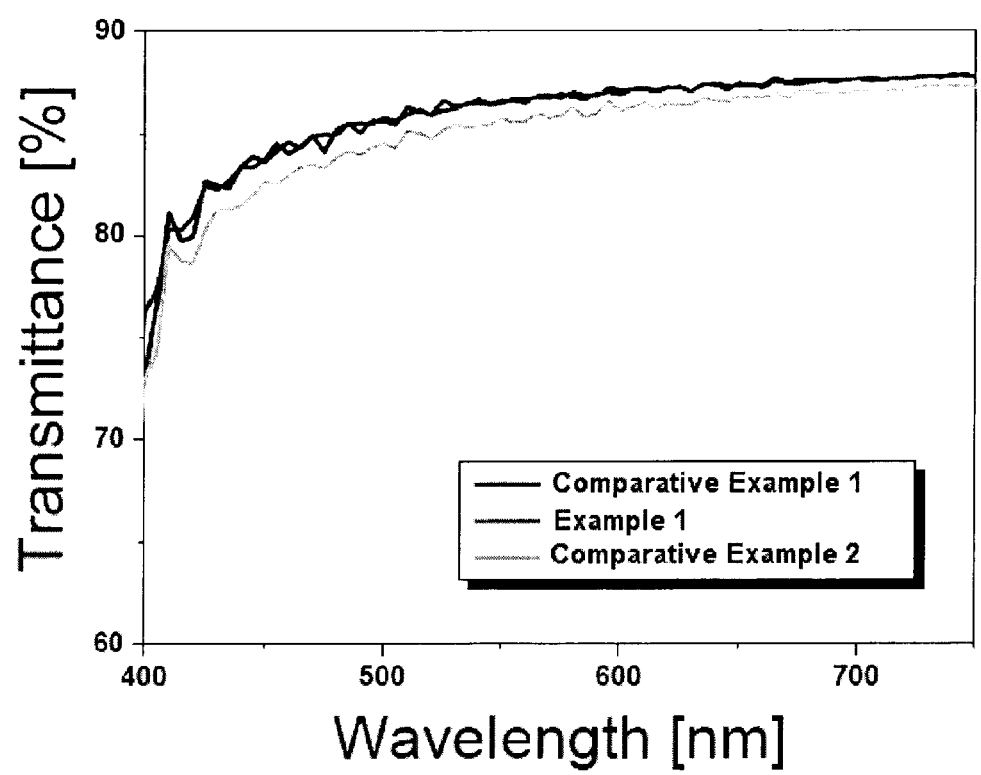
FIG. 8 shows optical transmittance of the conductive layers manufactured in Examples and Comparative Examples.

FIG. 8 shows optical transmittance of the PET films used in Example 1 and Comparative Examples 1 and 2. As seen from FIG. 8, the PET films of Example 1 and Comparative Examples 1 and 2 exhibited similar optical transmittance. Meanwhile, in Example 2, the conductive film had an average optical transmittance in the visible region of approximately 91.4%, in Example 3, the conductive film had an average optical transmittance in the visible region of approximately 91.9%, and in Example 4, the conductive film had an average optical transmittance in the visible region of approximately 94%.

Experimental Example 4

Contact Angle

Figure 9:
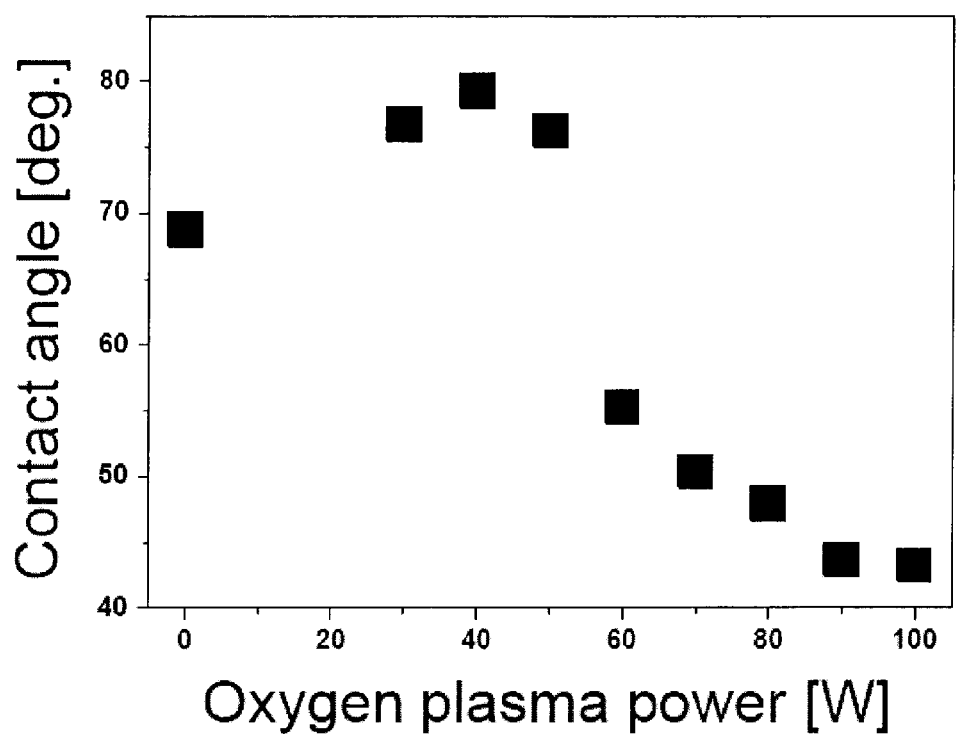
FIGS. 9 to 11 are diagrams showing a change in contact angle of a base layer according to whether or not to perform oxygen plasma treatment, ion beam treatment and/or increase in temperature.
Figure 10:
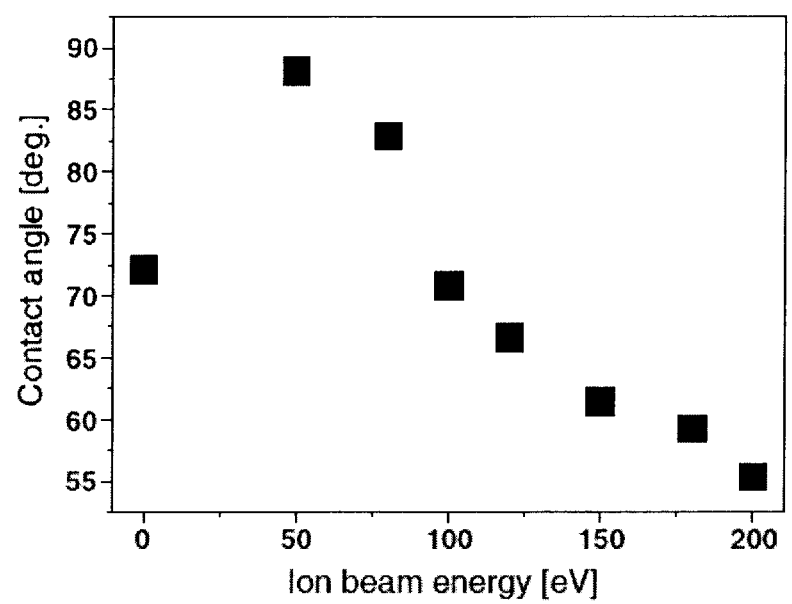
Figure 11:
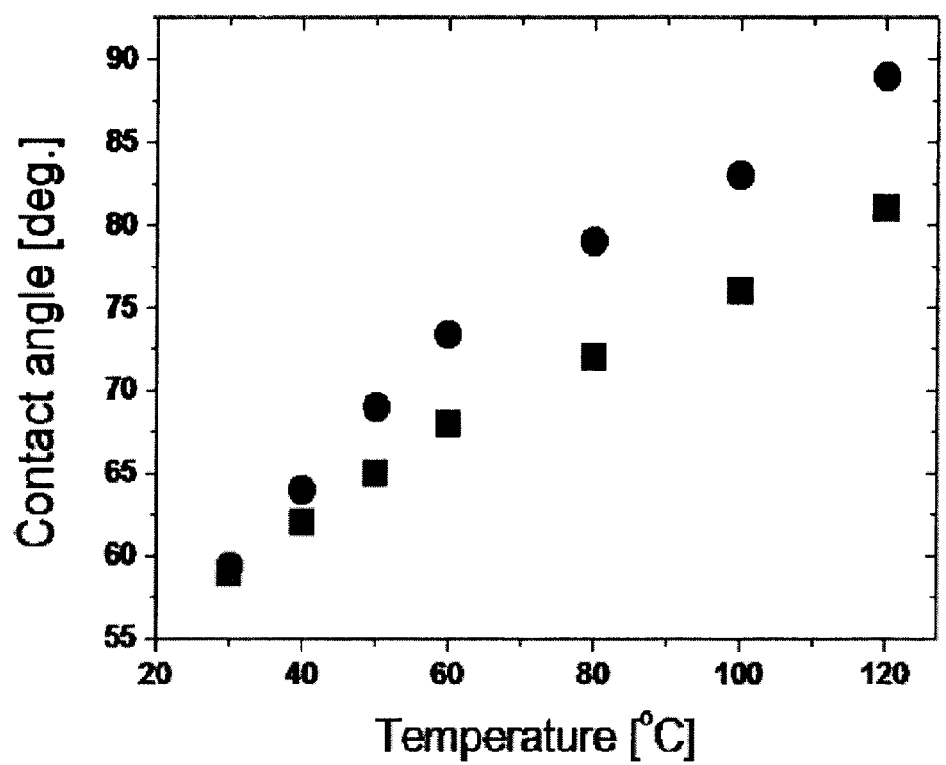

FIG. 9 is a diagram showing results of measurement of contact angles (Y axis) of a PET film by changing power (X axis) during oxygen plasma treatment. As shown in FIG. 9, when the plasma treatment power was in the range of 30 to 50 W, high contact angles of approximately 75 degrees or more were shown. In this case, it was confirmed that, when an ITO layer was formed on a surface of the PET film, the ITO layer had a suitable degree of crystallinity. However, when the power exceeded 50 W, the contact angle was 55 degrees or less, and in this case, an ITO layer which was amorphous or had a very low degree of crystallinity was obtained. FIG. 10. shows results of measurement of contact angles of the PET film by changing ion beam energy from 50 to 200 eV during ion beam treatment performed on the PET film by the same method as described in Example 2. It was confirmed from FIG. 10 that, when the ion beam energy is in the range of 50 to 70 eV, the contact angle was 80 degrees or more, but as the ion beam energy was increased, the contact angle drastically decreased. When the ion beam energy was in the range of 50 to 70 eV, the ITO layer exhibited suitable crystallinity after forming as to be described below, but as the ion beam energy was increased, the ITO layer was formed to be amorphous or have unsuitable crystallinity. FIG. 11 is a diagram showing a relationship between ion beam treatment and thermal treatment, and a contact angle of a PET film. In FIG. 11, a part represented as a circle shows a change in contact angle when the PET film was maintained at a temperature of 20 to 120° C. during ion beam treatment performed by the same method as described in Example 4, and a part represented as a square shows a change in contact angle when the PET film was maintained at a temperature of 20 to 120° C. without ion beam treatment. It was confirmed from FIG. 11 that, when the ion beam treatment was performed at approximately 50° C. or more, the contact angle of the PET film considerably increased. As a result, the ITO layer, which was formed on the PET film having such a high contact angle, had suitable crystallinity as shown in Example 4.

Experimental Example 5

Resistance and XRD

Figure 12:
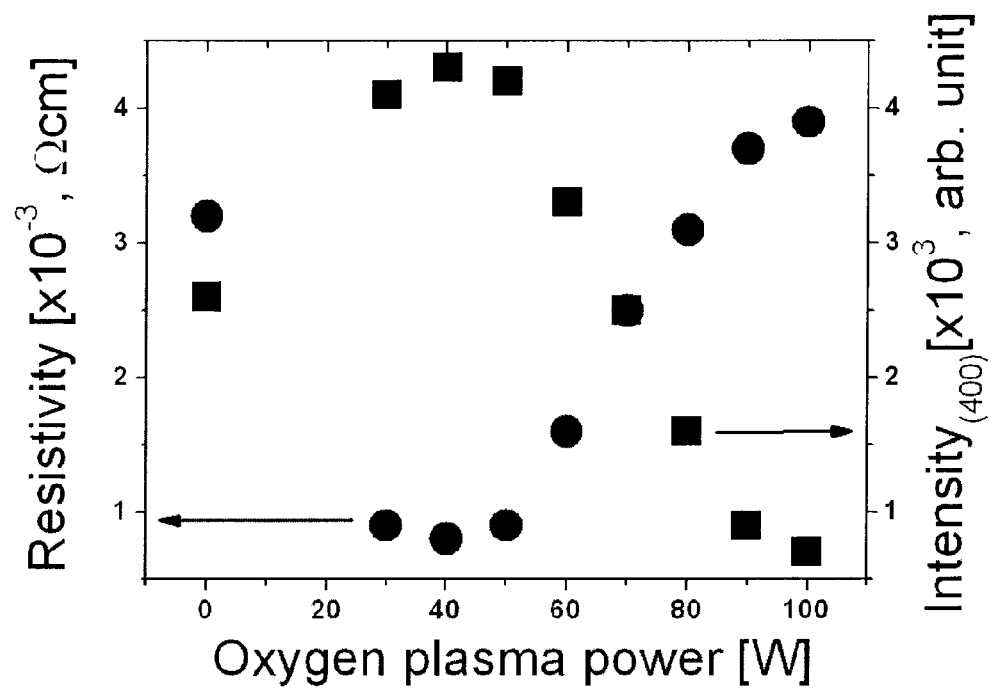
FIGS. 12 to 14 are diagrams showing resistance characteristics of the conductive layers manufactured in Examples and Comparative Examples.

FIG. 12 shows results of measurements of resistances of an ITO layer and intensities of a (400) line of an XRD pattern by changing power of plasma treatment from 30 W to 100 W when oxygen plasma treatment and formation of the ITO layer were performed by the same method as described in Example 1.

Figure 13:
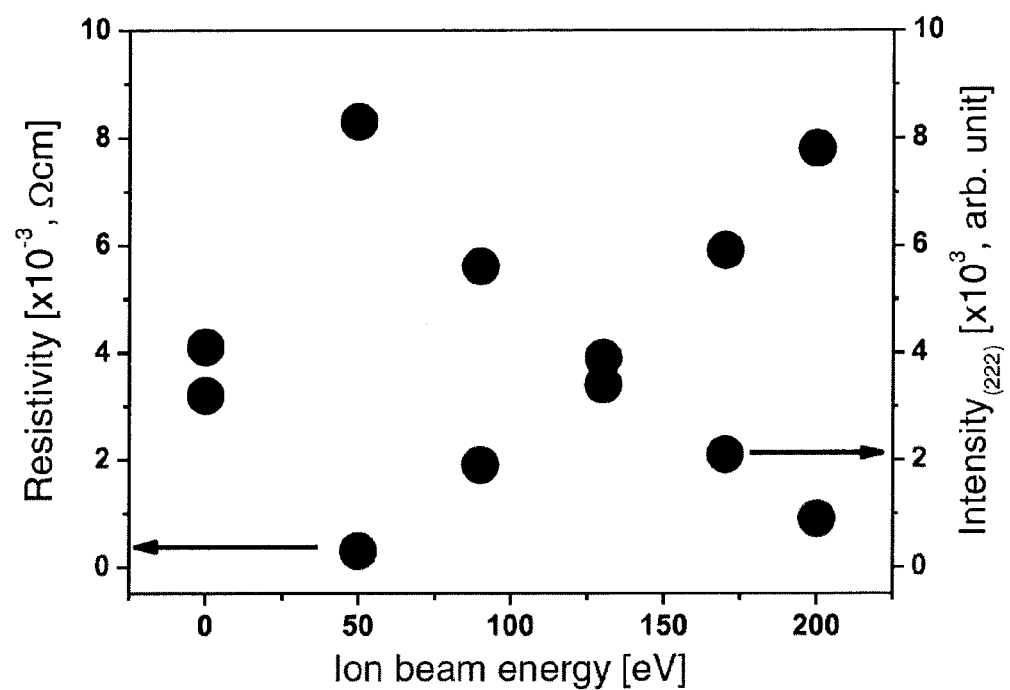
Figure 14:
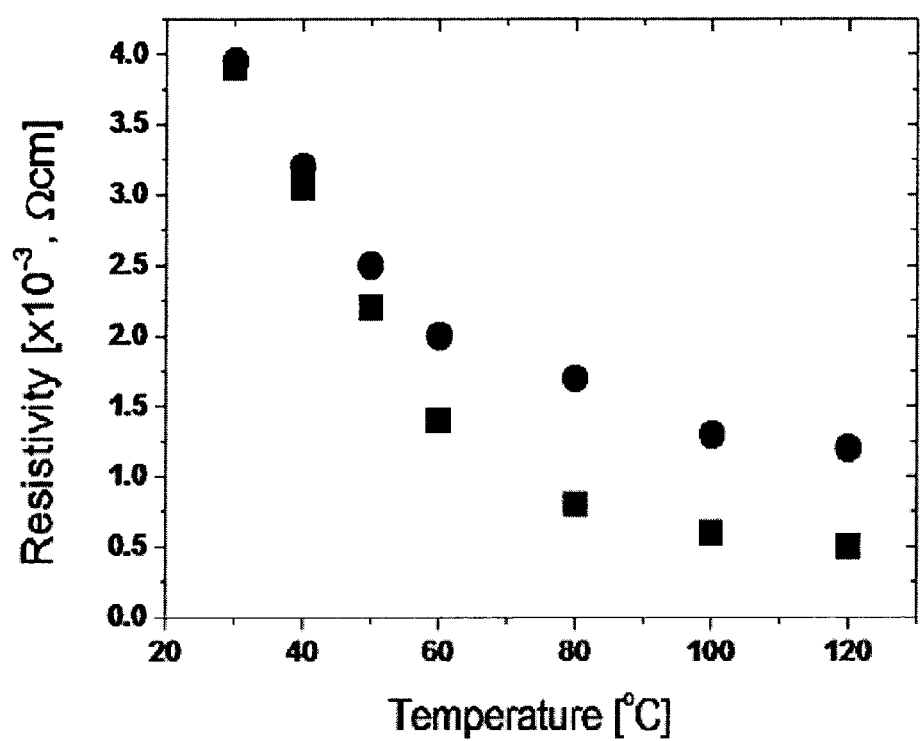

It was confirmed from FIG. 12 that, when the ITO layer was formed after plasma treatment performed in the range of 30 to 50 W, the resistance was maintained at $1 \times 10^{-3}$ Ωcm or less, but when power exceeded 50 W, the resistance drastically increased. Meanwhile, the intensity of the (400) line of the XRD pattern was changed to be similar to the resistance. FIG. 13 is a diagram showing a change in resistance and intensity of a (222) line of the XRD pattern by changing energy of ion beam treatment when a conductive layer was formed by the same method as described in Example 2. It was seen from FIG. 13 that balanced resistance and degree of crystallinity were ensured in the range of the ion beam energy from 50 to 70 eV. FIG. 14 is a diagram showing changes in resistance of the ITO layer according to whether or not to perform ion beam treatment on a PET film and a temperature at which the ion beam treatment was performed. In FIG. 14, a part represented as a circle shows the change in resistance of an ITO layer formed on a only thermally treated PET film as described in Comparative Example 3, and a part represented as a square shows the change in resistance of an ITO layer formed on an ion beam-treated PET film when a temperature at which the ion beam treatment was performed was changed as described in Example 4. It was confirmed from FIG. 14 that the ITO layer formed on the PET film ion beam-treated at a predetermined temperature exhibited an excellent resistance characteristic.

Experimental Example 6

Changes in Physical Properties According to Number of Ion Beam Treatment

Figure 15:
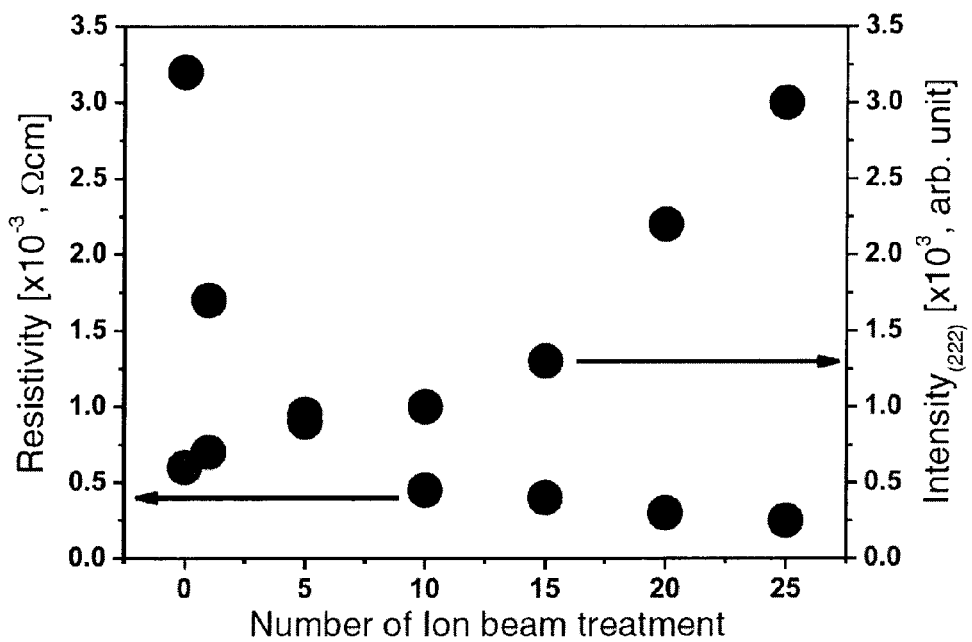
FIG. 15 is a diagram showing characteristics of a conductive layer depending on the number of repeating ion beam treatment.

FIG. 15 is a diagram showing changes in resistance and intensity of the (222) line of the XRD pattern when ion beam treatment was performed under the same condition of Example 2 or 3 by changing the number of repeating the ion beam treatment. The repetition number was calculated in such a manner that when ion beam treatment was performed only on the PET film as described in Example 2, it was counted as a first cycle, when ion beam treatment was performed after an ITO layer was formed on the ion beam-treated PET film as shown in Example 3, it was counted as a second cycle, and when ion beam treatment was performed again after an ITO layer was formed on the ITO layer formed in the second cycle, it was counted as a third cycle. It was seen from FIG. 15 that, as the number of repeating ion beam treatment was increased, the resistance drastically decreased, and the intensity of the (222) line increased.

According to the present application, a conductive layer, which is formed without, so called, a high temperature process, but has suitable crystallinity, and excellent transparency and resistance characteristic, and a method of manufacturing the conductive layer are provided.

While the invention has been shown and described with reference to certain exemplary embodiments thereof, it will be understood by those skilled in the art that various changes in form and details may be made therein without departing from the scope of the invention as defined by the appended claims.

What is claimed is:

1. A conductive layer, that has a peak at (222) or (400) plane in an X-ray diffraction (XRD) pattern and a resistivity measured by a four-point probe method of $2\times10^{-3}$ Ω·cm or less and that is formed on a surface, of which a contact angle at a room temperature with respect to distilled water is 75 degrees or more,
wherein the surface is a surface of a plastic base layer on which ion beam treatment is performed with an ion beam energy of 50 to 70 eV.

2. The conductive layer according to claim 1, wherein the peak at the (222) plane has an intensity of 100 AU or more.

3. The conductive layer according to claim 1, wherein the peak at the (400) plane has an intensity of 100 AU or more.

4. The conductive layer according to claim 1, wherein the contact angle of the surface is 80 degrees or more.

5. The conductive layer according to claim 1, which has an optical transmittance with respect to at least one wavelength in the visible region of 80% or more.

6. The conductive layer according to claim 1, which includes indium oxide.

7. The conductive layer according to claim 1, which includes 85 to 95 parts by weight of indium oxide and 5 to 15 parts by weight of tin oxide.

8. A conductive film, comprising:
a plastic base layer having a surface having a room temperature contact angle with respect to distilled water of 75 degrees or more; and
a conductive layer formed on the surface of the plastic base layer having a peak at (222) or (400) plane in an X-ray diffraction (XRD) pattern and a resistivity measured by a four-point probe method of $2\times10^{-3}$ Ω·cm or less,
wherein the surface is a surface of the plastic base layer on which ion beam treatment is performed with an ion beam energy of 50 to 70 eV.

9. The film according to claim 8, wherein the conductive layer is formed in contact with the surface of the plastic base layer having the room temperature a contact angle with respect to distilled water of 75 degrees or more.

10. A method of manufacturing a conductive layer, comprising forming a conductive layer on a surface having a room temperature contact angle with respect to distilled water of 75 degrees or more to yield the conductive layer that has a peak at (222) or (400) plane in an X-ray diffraction (XRD) pattern and resistivity measured by a four-point probe method of $2\times10^{-3}$ Ω·cm or less,
wherein the surface is a surface of a plastic base layer on which ion beam treatment is performed with an ion energy of 50 to 70 eV.

11. The method according to claim 10, wherein the surface having a contact angle of 75 degrees or more is a surface of a base layer on which oxygen plasma treatment is performed with a power of 20 to 50 W.

12. The method according to claim 10, further comprising:
performing ion beam treatment on the conductive layer formed on the surface of the plastic base layer on which ion beam treatment is performed with an ion energy of 50 to 70 eV.

13. The method according to claim 12, further comprising:
additionally forming a conductive layer on the ion beam-treated conductive layer; and
performing ion beam treatment on the additionally-formed conducive layer.

14. The method according to claim 13, wherein the forming of the conductive layer and the ion beam treatment performed on the formed conductive layer are repeated 10 to 40 times.

15. The method according to claim 10, wherein the ion beam treatment with respect to the base layer is performed at a temperature of 70 to 200° C.

16. The method according to claim 15, wherein the base layer, which is ion beam treated at 70 to 200° C., is maintained at 70 to 200° C.

17. A conductive layer manufactured by the method of claim 10.

* * * * *